United States Patent
Odagiri

(10) Patent No.: US 11,602,042 B2
(45) Date of Patent: Mar. 7, 2023

(54) ELECTRONIC APPARATUS

(71) Applicant: Sony Interactive Entertainment Inc., Tokyo (JP)

(72) Inventor: Kazuya Odagiri, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 17/276,903

(22) PCT Filed: Sep. 24, 2019

(86) PCT No.: PCT/JP2019/037308
§ 371 (c)(1),
(2) Date: Mar. 17, 2021

(87) PCT Pub. No.: WO2020/067030
PCT Pub. Date: Apr. 2, 2020

(65) Prior Publication Data
US 2021/0360774 A1    Nov. 18, 2021

(30) Foreign Application Priority Data

Sep. 28, 2018 (JP) .............................. JP2018-184703

(51) Int. Cl.
*H05K 9/00* (2006.01)
*H05K 1/02* (2006.01)

(52) U.S. Cl.
CPC ......... *H05K 1/0224* (2013.01); *H05K 9/0024* (2013.01)

(58) Field of Classification Search
CPC .................................................. H05K 9/0024
See application file for complete search history.

(56) References Cited

U.S. PATENT DOCUMENTS

| 6,560,125 | B1 | 5/2003 | Shmagin |
| 8,223,507 | B2 | 7/2012 | Tanno |

(Continued)

FOREIGN PATENT DOCUMENTS

| EP | 2217050 A1 | 8/2010 |
| JP | 2001077608 A | 3/2001 |

(Continued)

OTHER PUBLICATIONS

Machine translation of JP 2017-79372, translated on Feb. 26, 2022, 8 pages (Year: 2022).*

(Continued)

*Primary Examiner* — Hung V Ngo
(74) *Attorney, Agent, or Firm* — Matthew B. Dernier, Esq.

(57) ABSTRACT

An electronic apparatus includes a printed board and an electroconductive shield member disposed such as to cover a shield area which is a part of a front surface of the printed board. A wiring connecting an inside and an outside of the shield area is disposed on the front surface of the printed board. The shield member has an opening that connects an inside and an outside of the shield member, at a position where the wiring passes through an outer edge of the shield area, and that extends in an extending direction of the wiring. The opening is electrically connected to a conductor disposed on an opposite side of the wiring from the opening, and the opening and the conductor form a waveguide surrounding the wiring.

7 Claims, 2 Drawing Sheets

(56) References Cited

U.S. PATENT DOCUMENTS

| | | | |
|---|---|---|---|
| 10,779,395 B1* | 9/2020 | Harrigan | H05K 9/0037 |
| 2010/0259905 A1 | 10/2010 | Tanno | |
| 2016/0227681 A1* | 8/2016 | Miller | H05K 9/003 |
| 2017/0025362 A1* | 1/2017 | Nguyen | H01L 24/43 |
| 2020/0329593 A1* | 10/2020 | Khan | H05K 9/0073 |

FOREIGN PATENT DOCUMENTS

| | | |
|---|---|---|
| JP | 2006101286 A | 4/2006 |
| JP | 2010251375 A | 11/2010 |
| JP | 2017079372 A | 4/2017 |

OTHER PUBLICATIONS

International Search Report for corresponding PCT Application No. JP2019/037308, 4 pages, dated Nov. 19, 2019.
International Preliminary Report on Patentability and Written Opinion for corresponding PCT Application No. JP2019/037308, 11 pages, dated Apr. 8, 2021.
Extended European Search Report for corresponding EP Application No. 19866130.8, 7 pages, dated May 20, 2022.
Decision to Grant a Patent for corresponding JP Application No. 2020-549228, 4 pages, dated Apr. 26, 2022.

\* cited by examiner

ELECTRONIC APPARATUS

TECHNICAL FIELD

The present invention relates to an electronic apparatus incorporating a printed board.

BACKGROUND ART

In general, an electronic apparatus incorporates a printed board on which various circuit elements are mounted. The circuit elements include one that generates an electromagnetic field serving as a noise influencing operations of other circuit elements and wireless communication and the like. In order to prevent propagation of such a noise, a counterplan of shielding the circuit element serving as a noise generation source by a shield member formed from a metallic sheet or the like has been practiced.

[SUMMARY] [TECHNICAL PROBLEM]

In the case of providing a wiring for connecting the circuit elements on a front surface of the printed board, the wiring cannot make contact with the shield member; therefore, the circuit element serving as a noise generation source cannot be perfectly covered with the shield member, and it is necessary to provide an opening part through which to pass the wiring. However, such an opening part may become a route of leakage of noise.

The present invention has been made in consideration of the above-mentioned circumstances. One of the objects of the present invention is to provide an electronic apparatus in which a noise generated from a circuit element disposed on a printed board can be effectively restrained by a shield member.

Solution to Problem

An electronic apparatus according to the present invention includes a printed board and an electroconductive shield member disposed such as to cover a shield area which is a part of a front surface of the printed board. A wiring connecting an inside and an outside of the shield area is disposed on the front surface of the printed board. The shield member has an opening that connects an inside and an outside of the shield member, at a position where the wiring passes through an outer edge of the shield area, and that extends in an extending direction of the wiring. The opening is electrically connected to a conductor disposed on an opposite side of the wiring from the opening, and the opening and the conductor form a waveguide surrounding the wiring.

DESCRIPTION OF EMBODIMENT

An embodiment of the present invention will be described in detail below, based on the drawings.

An electronic apparatus according to an embodiment of the present invention is, for example, a home game machine or the like, and includes a printed board (printed wiring board) 10 on which various circuit elements are mounted, and a shield member 20 for preventing propagation of noises generated on the printed board 10. Note that hereinbelow, as a specific example, the printed board 10 is a multilayer substrate having one or more pattern layers, not only on a front surface and a back surface but also in an inside thereof.

Figure 1:
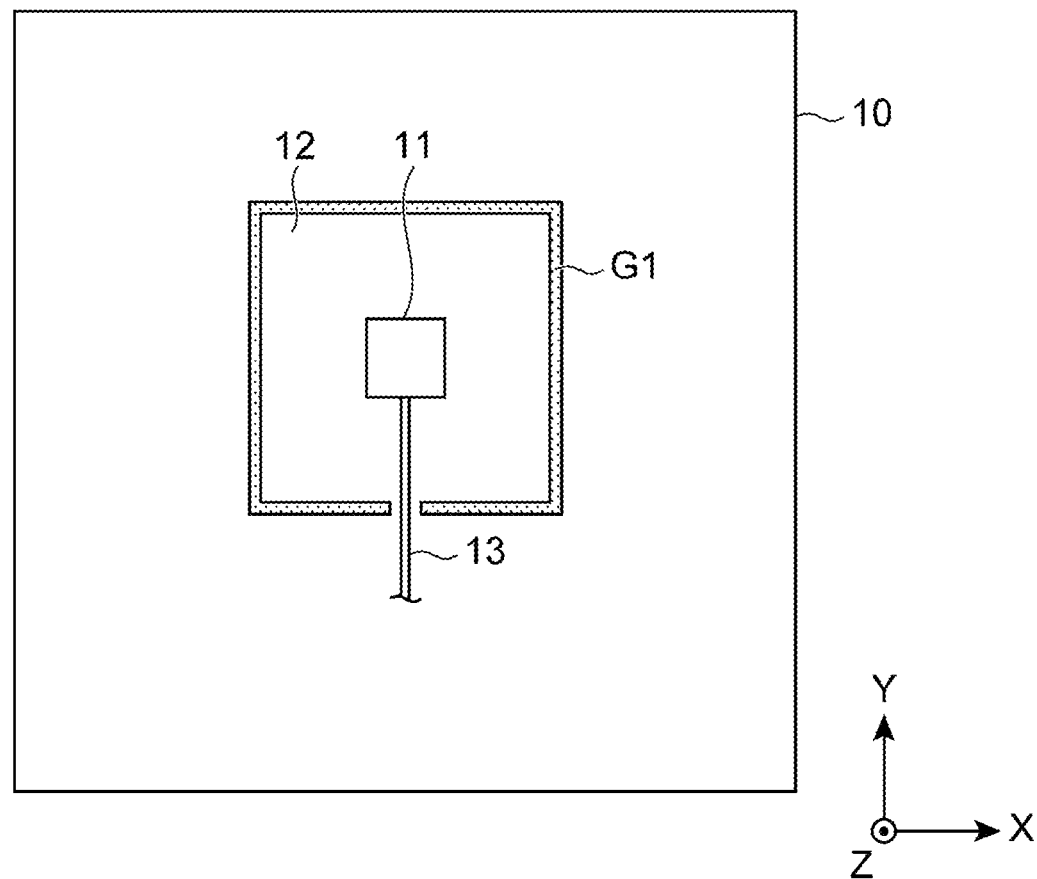
FIG. 1 is a plan view of a printed board incorporated in an electronic apparatus according to an embodiment of the present invention.

FIG. 1 is a plan view schematically depicting a manner of the front surface of the printed board 10 in a state in which the shield member 20 is not attached thereto. As illustrated in the figure, at least one circuit element 11 serving as a noise generation source is disposed on the front surface of the printed board 10 in the present embodiment, and a shield area 12 as an object of shielding by the shield member 20 is set such as to surround the circuit element 11. A ground pattern G1 is formed on the front surface of the printed board along a peripheral part of the shield area 12. The ground pattern G1 is a pattern of which a potential is maintained at a fixed reference potential (ground).

For connecting the circuit element 11 and another circuit element (not illustrated) disposed outside the shield area 12, a wiring (surface layer wiring) 13 is formed on the front surface of the printed board 10. The wiring 13 is disposed such as to connect an inside and an outside of the shield area 12 across a periphery of the shield area 12. While only one wiring 13 is depicted to its intermediate portion in FIG. 1, a plurality of wirings 13 extending across the periphery of the shield area 12 may be present. Hereinbelow, an extending direction of the wiring 13 at a part where it intersects the periphery of the shield area 12 will be a Y-axis direction, and a direction intersecting the Y-axis direction in plan view will be an X-axis direction. In addition, a thickness direction of the printed board 10 will be a Z-axis direction. Due to the wiring 13, the ground pattern G1 is interrupted at that part of the periphery of the shield area 12 through which the wiring 13 passes.

Figure 2:
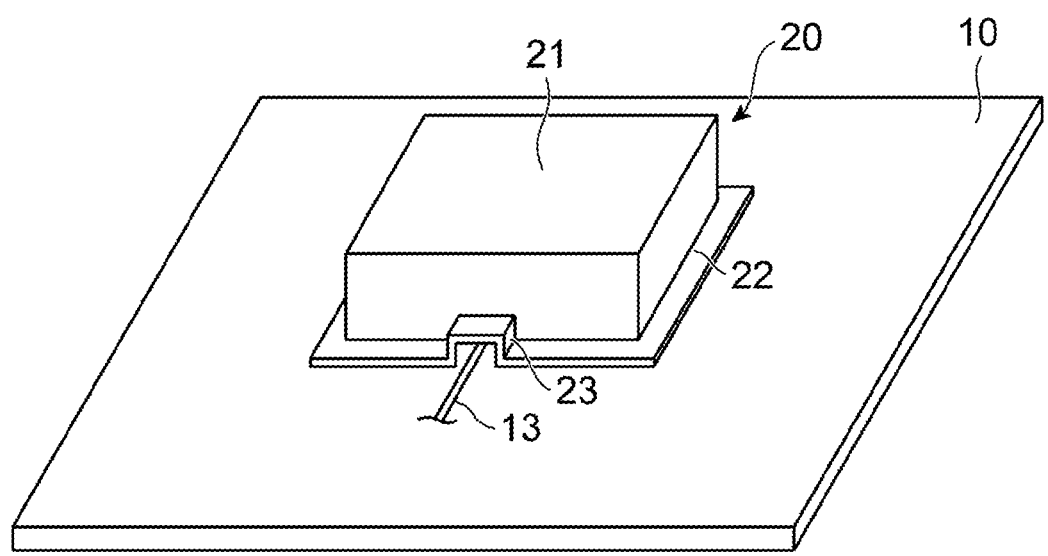
FIG. 2 is a perspective view of the printed board to which a shield member is attached.

FIG. 2 is a perspective view depicting a manner of the front surface of the printed board 10 in a state in which the shield member 20 is attached thereto. As illustrated in the figure, the shield member 20 includes a main body part 21 that shields the inside of the shield area 12, a flange 22, and an opening 23. The shield member 20 is formed from an electroconductive material such as a metallic material, and is fixed onto the front surface of the printed board 10 in such a manner as to cover the shield area 12 including the circuit element 11.

The main body part 21 has a shape recessed from the printed board 10 side, and is disposed such as to face the shield area 12. As a result, a space surrounded by the shield area 12 on the front surface of the printed board 10 and an inside surface of the main body part 21 is formed in the inside of the shield member 20. The shield member 20 prevents propagation of a noise generated in the space to the outside. Note that here the main body part 21 has a rectangular shape in plan view, the shape of the main body part 21 is not limited to such a shape, and may have any of various shapes according to a layout of the circuit element or the like as an object of shielding.

The flange 22 is formed along a periphery of the main body part 21 such as to project further to the outside from the periphery of the main body part 21, and its surface facing the printed board 10 is flat. At the time of fixing the shield member 20 to the printed board 10, the flange 22 makes contact with the ground pattern G1 formed along the periphery of the shield area 12, and is electrically connected to the ground pattern G1. As a result, the shield member 20 is grounded and shields the shield area 12 inclusive of the circuit element 11, so that the noise generated in the inside thereof can be prevented from being propagated to the outside. Note that for enhancing a noise shielding effect of the shield member 20, it is desirable to enhance a pressure of contact of the flange 22 with the ground pattern G1 and to lower a contact resistance. In view of this, in the present embodiment, screws 24 are passed through tapped holes formed in the printed board 10 and the flange 22, and the shield member 20 is put into close contact with the printed board 10 by fastening the screws 24.

However, since the flange 22 cannot be put into contact with the printed board 10 at a part where the wiring 13 passes, it is necessary to provide the shield member 20 with an opening at a part which faces the wiring 13. Therefore, in a case where the wiring 13 extending across the periphery of the shield area 12 is disposed on the front surface of the printed board 10, the inside of the shield area 12 cannot be completely hermetically closed with the shield member 20, so that a noise may leak to the outside through the opening part.

In view of this, in the present embodiment, the opening 23 having a tubular shape is provided at that position of an outer edge of the shield member 20 through which the wiring 13 passes. The space inside the shield member 20 and the outside of the shield member 20 are connected by the opening 23, and the wiring 13 connects the inside and the outside of the shield area 12 by passing through the opening 23. The opening 23 is formed from an electroconductive member similarly to the main body part 21 and the flange 22 and, as will be described in detail later, functions as a waveguide for permitting only an electromagnetic wave of a specific frequency to pass therethrough. As a result, notwithstanding that the opening 23 permitting the wiring 13 to pass therethrough is provided, an electromagnetic wave of such a frequency as to need a noise counterplan can be prevented from being propagated to the outside of the shield member 20.

The opening 23 may be a member formed integrally with the main body part 21. In this case, for example, by processing a single metallic sheet, the whole part of the shield member 20 can be formed. Alternatively, the opening 23 may be a member which is formed as a part separate from the main body part 21 and is connected with the main body part 21.

Figure 3:
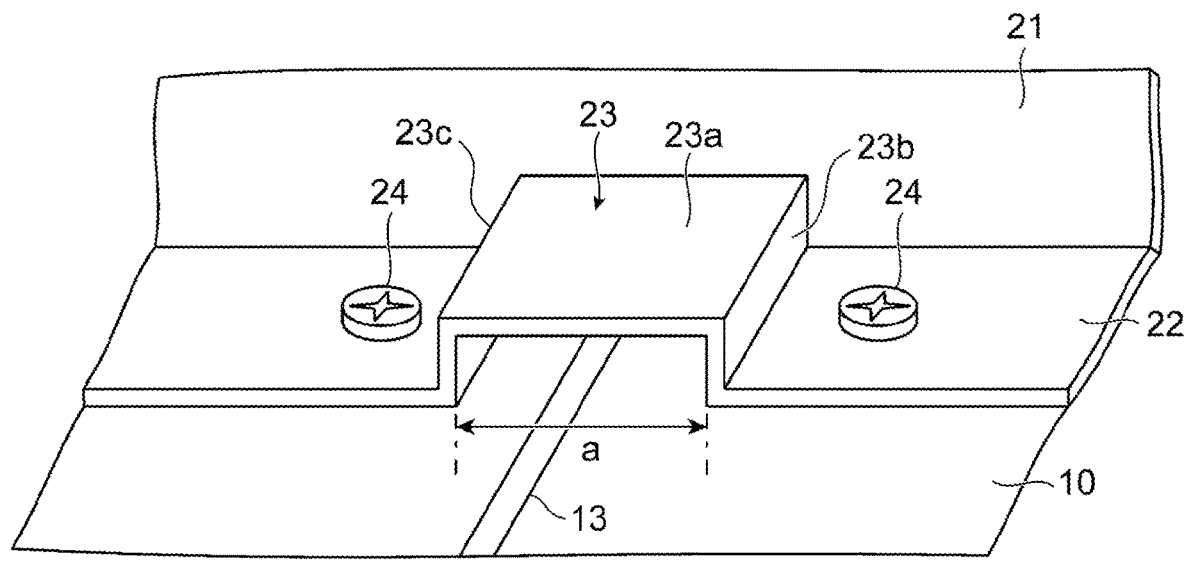
FIG. 3 is a partially enlarged view of the shield member.
Figure 4:
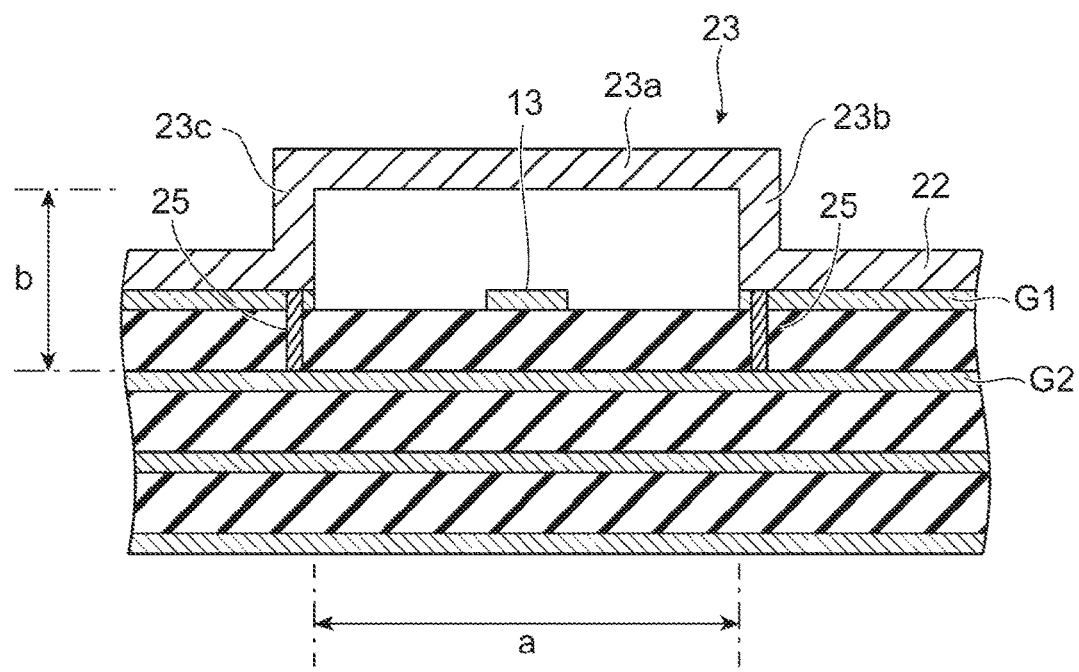
FIG. 4 is a sectional view of an opening.

A specific shape of the opening 23 will be described below. FIG. 3 is a partially enlarged view of a periphery of the opening 23 of the shield member 20 depicted in FIG. 2. FIG. 4 is a partial sectional view schematically depicting a sectional shape of the opening 23, and illustrates a manner in which the printed board 10 with the shield member 20 disposed thereon is cut along a section intersecting the Y-axis direction. The opening 23 has an elongate tubular shape extending along the extending direction of the wiring 13, and is disposed such as to cover the wiring 13.

As illustrated in these figures, the opening 23 has a U-shaped section opening to a lower side as viewed in the extending direction of the wiring 13. More specifically, the opening 23 includes an upper surface part 23a disposed substantially in parallel to the printed board 10, and two side surface parts 23b and 23c connected to the upper surface part 23a. The upper surface part 23a is disposed such as to face the wiring 13 at a position where the wiring 13 passes through the outer edge of the shield area 12. The side surface parts 23b and 23c are connected to, of a periphery of the upper surface part 23a, two end portions extending along the Y-axis direction (the extending direction of the wiring 13) (namely, two end portions on both sides of the wiring 13 in plan view), and extend from the connection parts toward the printed board 10. In other words, the side surface parts 23b and 23c are disposed on both sides of the wiring 13 substantially in parallel to each other and substantially perpendicularly to the front surface of the printed board 10. Those end portions of the two side surface parts 23b and 23c which are on a side opposite to the upper surface part 23a side make contact with end portions of the ground pattern G1 formed along the periphery of the shield area 12 on the printed board 10. As a result, the wiring 13 is covered with the opening 23 at a part where the wiring 13 passes through the periphery of the shield area 12.

However, the opening 23 has a downwardly opening sectional shape for permitting the wiring 13 to pass through the inside thereof, and does not have a perfectly tubular shape. Therefore, the opening 23 as it is cannot function as a waveguide. In view of this, in the present embodiment, a ground layer G2 formed inside the printed board 10 is utilized as a part of a waveguide, as depicted in FIG. 4. As described above, the printed board 10 in the present embodiment is a multilayer substrate, with the ground layer G2 formed in the inside thereof. The ground layer G2 maintains a reference potential, like the ground pattern G1. The ground layer G2 is formed also at a position facing the opening 23 in plan view. Therefore, by electrically connecting the opening 23 with the ground layer G2, the opening 23 and the ground layer G2 as a whole form a tubular waveguide surrounding the wiring 13, as depicted in FIG. 4. Note that while a sectional shape of the waveguide formed by the opening 23 and the ground layer G2 is a substantially rectangular shape here, the shape of the opening 23 is not limited to such a shape and may be other shape such as an arcuate shape.

In addition, the opening 23 has a rectangular shape protruding from the main body part 21 in plan view. While a width of the opening 23 is assumed to be constant from a base part connected to the main body part 21 to the opening part at a tip end here, the opening 23 may have a tapered shape in which the opening part at the tip end is smaller in width than the base part. On the other hand, a shape in which the opening 23 becomes wider in going toward the tip end is unpreferable. In other words, a width of a tip end portion of the opening 23 in plan view is preferably equal to or less than a width on the shield area 12 side. As a result, a noise is less liable to be propagated through the inside of the opening 23 to the outside.

In order to form a waveguide by the opening 23 and the ground layer G2, the opening 23 is electrically connected to the ground layer G2 inside the printed board 10 by a plurality of vias 25 aligned in the Y-axis direction. In a case where the opening 23 is connected to the ground layer G2 by the plurality of vias 25, since the vias 25 are disposed at intervals along the Y-axis direction, a gap part where the opening 23 is not connected to the ground layer G2 in sectional view may be generated. However, if such a gap is a short spacing as compared to a wavelength of a noise to be shielded by the opening 23, the opening 23 and the ground layer G2 as a whole function as a waveguide.

In order to electrically connect the opening 23 to the vias 25 provided in the printed board 10, it is necessary to put also a lower end of the opening 23 into close contact with the printed board 10, like the flange 22. Therefore, as depicted in FIG. 3, it is desirable, in screwing the flange 22 to the printed board 10 by the screws 24, to screw parts as near as possible to the opening 23. In addition, while the opening 23 is assumed here to be electrically connected to the ground layer G2 by the vias 25, this is not limitative, and the opening 23 and the ground layer G2 may be electrically connected to each other by other method.

A frequency of an electromagnetic wave which can be shielded by the opening 23 will be described below. It is assumed that the section of the waveguide formed by the opening 23 and the ground layer G2 is a rectangular shape having a width a and a height b (a>b). A shield wavelength (a limit wavelength of electromagnetic waves transmitted) λc of such a rectangular waveguide is calculated by the following calculation formula.

$$\lambda_c = \frac{1}{\sqrt{\left(\frac{m}{2a}\right)^2 + \left(\frac{n}{2b}\right)^2}}$$ [Math. 1]

Here, m and n are integers defining a transmission mode of the electromagnetic wave propagated through an inside of the waveguide. A case where the shield wavelength λc becomes the longest (in other words, a case where the frequency becomes the lowest) is the case where m=1 and n=0, in which case λc=2a.

In this instance, a corresponding shield frequency fc is calculated by fc=Vc/2a.

Here, Vc is a light velocity (=3×10$^{10}$ cm/s).

Electromagnetic waves of frequencies lower than the shield frequency fc calculated from the value of a by the above-described calculation formula do not pass through the waveguide. Therefore, for example, where the width a of the opening 23 is 10 mm, noises of frequencies lower than approximately 15 GHz can be shielded. By determining the width a of the opening 23 taking into account the frequency of the noise generated from the circuit element 11 and the frequencies of noises to be shielded by the shield member 20 (for example, the frequency used by wireless communication or the like outside the shield member 20), the noises of the desired frequencies can be effectively shielded. Particularly, in wireless local area network (LAN) communication, frequency bands in a vicinity of 2.4 GHz and 5 GHz are used. Accordingly, in a case where an antenna or the like for performing wireless LAN communication at these frequency bands is disposed outside the shield area 12, it is desired to shield noises of frequencies equal to or lower than 5 GHz by the shield member 20. In this case, it is desirable that the width a and the height b of the opening 23 are set to values smaller than 30 mm.

In addition, while a length L of the opening 23 as measured along the Y-axis direction does not directly influence the frequency of the electromagnetic wave transmitted through the opening 23, the electromagnetic wave is more attenuated in the process of transmission through the inside of the opening 23 as the length L is longer, so that the shielding effect is higher. Therefore, by setting longer the length of the opening 23 in the Y-axis direction within a range permitted on a circuit design basis, it is possible to make it more difficult for the noise of a desired frequency to be propagated to the outside.

As has been described above, according to the electronic apparatus according to the present embodiment, by providing the shield member 20 with the opening, it is possible to dispose the wiring 13 on the front surface of the printed board 10 even in a case where it is difficult to pass the wiring through an inside layer of the multilayer substrate. In addition, heat generated by the circuit element inside the shield member 20 or the like can be efficiently radiated. Besides, by providing at the opening part the opening 23 that functions as a waveguide for permitting passage therethrough of only the electromagnetic waves of specific frequency bands, it is possible to restrain leakage of noise in a desired frequency band to the outside through the opening part.

Note that the embodiment of the present invention is not limited to the above-described. For example, as described above, the shapes of the shield member 20 and the opening 23 are not limited to the above-described, and any of various shapes that produces a similar action or effect may also be adopted. In addition, while only one opening 23 is provided in the shield member 20 in the above description, a plurality of openings 23 may be provided at different positions. Besides, while the extending direction of the wiring 13 and the opening 23 is orthogonal to the periphery of the shield area 12 in the above description, this is not limitative, and the wiring 13 and the opening 23 may be disposed in a direction obliquely intersecting the periphery of the shield area 12.

In addition, in the above description, the ground layer G2 formed in a first layer from the front surface of the printed board 10 on which the opening 23 is disposed constitutes the waveguide together with the opening 23. However, this is not limitative; any conductor that is electrically connected to the opening 23 and that is disposed on an opposite side of the wiring 13 from the opening 23 can constitute a waveguide together with the opening 23 and can prevent propagation of noise through the opening through which the wiring 13 passes. Specifically, the conductor constituting the waveguide may be a ground layer formed in the second or latter inside layer from the front surface of the printed board 10. Besides, the conductor may be a ground pattern formed on a surface (back surface) of the printed board 10 on a side opposite to a side on which the opening 23 is disposed. In this case, the printed board 10 may not be a multilayer substrate.

In addition, while the opening 23 is a part of the shield member 20 in the above description, the opening 23 and the shield member 20 may include separate parts. In this case, for example, a tubular opening 23 may be previously fixed to the printed board 10 by soldering or the like, and a shield member 20 provided with an opening in a shape according to a shape of the opening 23 may be further fixed from an upper side of the opening 23. As a result, the opening that connects the inside and the outside of the shield member 20 can be formed in a tubular shape. In this case, it is sufficient that the shield member 20 is fixed by screwing or the like, such that the shield member 20 makes close contact with the opening 23.

REFERENCE SIGN LIST

10: Printed board
11: Circuit element
12: Shield area
13: Wiring
20: Shield member
21: Main body part
22: Flange
23: Opening
24: Screw
25: Via

The invention claimed is:

1. An electronic apparatus comprising:
a printed board; and
an electroconductive shield member disposed such as to cover a shield area which is a part of a front surface of the printed board,
wherein a wiring connecting an inside and an outside of the shield area is disposed on the front surface of the printed board,
the shield member has an opening that connects an inside and an outside of the shield member, at a position where the wiring passes through an outer edge of the shield area, and that extends in an extending direction of the wiring, and
the opening is electrically connected to a conductor disposed on an opposite side of the wiring from the opening, the opening has a width (a) and a height (b), where the width is greater than the height relative to dimensions of the wiring and the conductor, such that the opening and the conductor form a waveguide surrounding the wiring.

2. The electronic apparatus according to claim 1, wherein the opening includes an upper surface part facing the wiring, and two side surface parts which extend from end parts of the upper surface part, on both sides of the wiring in plan view, toward the printed board and of which end portions on a side opposite to the upper surface part make contact with the printed board.

3. The electronic apparatus according to claim 1, wherein the printed board is a multilayer substrate, and
the conductor is a ground layer formed inside the printed board.

4. The electronic apparatus according to claim 3, wherein the opening is electrically connected to the ground layer by a plurality of vias provided in the printed board along the extending direction of the wiring.

5. The electronic apparatus according to claim 1, wherein the waveguide has a section in a substantially rectangular shape.

6. The electronic apparatus according to claim 1, wherein a width of the opening in plan view is equal to or less than 30 mm.

7. The electronic apparatus according to claim 1, wherein a width of the opening on the shield area side is equal to or more than a width of a tip end of the opening in plan view.

* * * * *